United States Patent
Kumagai et al.

(10) Patent No.: US 9,780,563 B2
(45) Date of Patent: Oct. 3, 2017

(54) POWER SYSTEM CONTROL SYSTEM AND DISTRIBUTED CONTROLLER USED IN SAME

(71) Applicant: Hitachi, Ltd., Chiyoda-ku, Tokyo (JP)

(72) Inventors: Masatoshi Kumagai, Tokyo (JP); Shota Omi, Tokyo (JP); Kenichiro Yamane, Tokyo (JP); Yasushi Harada, Tokyo (JP); Masahiro Watanabe, Tokyo (JP); Yasuo Sato, Tokyo (JP); Yasushi Tomita, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 210 days.

(21) Appl. No.: 14/768,938

(22) PCT Filed: Feb. 28, 2013

(86) PCT No.: PCT/JP2013/055286
§ 371 (c)(1),
(2) Date: Aug. 19, 2015

(87) PCT Pub. No.: WO2014/132374
PCT Pub. Date: Sep. 4, 2014

(65) Prior Publication Data
US 2016/0013648 A1     Jan. 14, 2016

(51) Int. Cl.
*H02J 3/16*     (2006.01)
*G01R 19/25*    (2006.01)
*H02J 3/00*     (2006.01)

(52) U.S. Cl.
CPC ............ *H02J 3/16* (2013.01); *G01R 19/25* (2013.01); *H02J 2003/007* (2013.01);
(Continued)

(58) Field of Classification Search
CPC ........... H02J 3/14; H02J 3/16; H02J 2003/007
(Continued)

(56) References Cited

U.S. PATENT DOCUMENTS

2012/0022713 A1* 1/2012 Deaver, Sr. ............ G05B 17/02
                                                         700/298
2013/0030586 A1   1/2013 Milosevic et al.

FOREIGN PATENT DOCUMENTS

CA    2 783 427 A1     1/2013
JP    2002-51464 A     2/2002
(Continued)

OTHER PUBLICATIONS

Chinese-language Office Action issued in counterpart Chinese Application No. 201380072311.2 dated Jan. 25, 2017 with English translation (Seventeen (17) pages).
(Continued)

*Primary Examiner* — John Poos
(74) *Attorney, Agent, or Firm* — Crowell & Moring LLP

(57) ABSTRACT

A distributed controller collects measurement value data of a voltage and a current in an own node and in another node; using the measurement voltage and the current of the own node and the measurement voltage and current of another node as input data, estimates a voltage or a current as a state quantity of the electric power system regarding another node from which the measurement value data cannot be collected, and outputs the estimate values; using the measurement data, the estimate value outputted from the state estimation functional unit and a voltage target value that has been set for each node, outputs the control commands for voltage controllers based on voltage change amounts to be distributed to the voltage control devices of the nodes including the own node. The voltages in the electric power system are controlled by superposition of voltage change amounts by the voltage control devices.

10 Claims, 6 Drawing Sheets

(52) U.S. Cl.
CPC ............... *Y02E 40/34* (2013.01); *Y02E 60/76* (2013.01); *Y04S 40/22* (2013.01)

(58) Field of Classification Search
USPC .......................................... 307/31, 35, 126
See application file for complete search history.

(56) References Cited

FOREIGN PATENT DOCUMENTS

| | | |
|---|---|---|
| JP | 2002-281669 A | 9/2002 |
| JP | 2007-6674 A | 1/2007 |
| JP | 2008-154418 A | 7/2008 |
| JP | 2008-278658 A | 11/2008 |
| JP | 2011-250629 A | 12/2011 |
| JP | 2012-5277 A | 1/2012 |
| JP | 2013-31362 A | 2/2013 |

OTHER PUBLICATIONS

Wei Zhilian, "Idle/Voltage Control Research Tactics on Line of SCADA Data," Chinese Master's Theses Full-text Database Engineering Science and Technology II, Feb. 15, 2009, C042-379, pp. 7-12 (Six (6) pages).

Extended European Search Report issued in counterpart European Application No. 13876590.4 dated Oct. 10, 2016 (Eight (8) pages).

Hao Zhu et al., "Multi-area State Estimation Using Distributed SDP for Nonlinear Power Systems", IEEE SmartGridComm 2012 Workship—Architectures and Modeling for the Smart Grid, Nov. 5, 2012, pp. 623-628, XP32347529 (Six(6) pages).

International Search Report (PCT/ISA/210) dated Jun. 4, 2013, with English translation (four (4) pages).

Japanese-language Written Opinion (PCT/ISA/237) dated Jun. 4, 2013 (five (5) pages).

\* cited by examiner

FIG. 6

| NODE NUMBER | UPDATE TIME | VOLTAGE [V] | ACTIVE CURRENT [A] | REACTIVE CURRENT [A] | RATED VOLTAGE [V] | RATED ACTIVE CURRENT [A] | RATED REACTIVE CURRENT [A] |
|---|---|---|---|---|---|---|---|
| 1 | 2012/12/05 10:10 | 6650 | 0 | 0 | 6600 | 0 | 0 |
| 2 | 2012/12/05 10:10 | 6625 | 70 | 50 | 6600 | 80 | 80 |
| 3 | — | — | — | — | 6600 | 0 | 0 |
| 4 | 2012/12/05 09:30 | 6580 | 0 | 30 | 6600 | 0 | 100 |
| 5 | 2012/12/04 12:00 | 6570 | 50 | 20 | 6600 | 80 | 80 |
| 6 | — | — | — | — | 6600 | 50 | 50 |
| ... | ... | ... | ... | ... | ... | ... | ... |

POWER SYSTEM CONTROL SYSTEM AND DISTRIBUTED CONTROLLER USED IN SAME

TECHNICAL FIELD

The present invention relates to an electric power system control system and a distributed controller used for the electric power system control system.

BACKGROUND ART

It is important for an electric power system or a distribution system to properly control and manage the voltages in the whole electric power system even when the power flow changes due to fluctuations in the loads.

For example, Patent Literature 1 discloses a technology for accurately estimating true values of the system state by calculating estimate values of measurement errors and correction amounts of the system state by power flow calculation from measurement values of voltages, currents, etc. acquired by sensors arranged in the distribution system and the power flow calculation based on system configuration data.

PRIOR ART LITERATURE

Patent Literature

Patent Literature 1: JP2008-154418A

SUMMARY OF THE INVENTION

Problem to be Solved by the Invention

According to the technology described in the Patent Literature 1, the true values of the system state can be estimated with high accuracy by calculating the estimate values of the measurement errors and the correction amounts of the system state by the power flow calculation from the measurement values of voltages, currents, etc. measured by the sensors arranged in the distribution system and the power flow calculation based on the system configuration data.

However, this technology is constructed on the assumption of centralized control in which the measurement values of all the sensors in the system can be acquired. Thus, the technology of the Patent Literature 1 is inapplicable to state estimation of distributed control in which the acquisition of the measurement values is limited by restriction regarding the communication line.

The object of the present invention, which has been made to resolve the above-described problem, is to reduce voltage deviation of the whole electric power system even in cases where the acquisition of the measurement values is limited by the restriction regarding the communication line.

Means for Solving the Problem

To resolve the above-described problem and achieve the object of the present invention, an electric power system control system in accordance with the present invention is configured as below.

An electric power system control system controlling voltages in an electric power system to which loads and voltage control devices are connected via nodes, comprising at least two distributed controllers making control commands for the voltage control devices, wherein the distributed controller includes a measurement value data collection functional unit, a state estimation functional unit, and an optimum control functional unit, wherein the measurement value data collection functional unit collects measurement value data from sensors measuring a voltage and a current in an own node to which the measurement value data collection functional unit belongs and measurement value data from sensors measuring a voltage and a current in another node to which the measurement value data collection functional unit does not belong, wherein the state estimation functional unit, using the measurement values of the voltage and the current of the own node and the measurement values of a voltage and a current of another node as input data, estimates a voltage or a current as a state quantity of the electric power system regarding another node from which the measurement value data cannot be collected, and outputs the estimate values, wherein the optimum control functional unit, using the measurement value data, the estimate value outputted from the state estimation functional unit and a voltage target value that has been set for each node as input, outputs the control commands based on operation amounts to be distributed to the voltage control devices of the nodes including the own node, and wherein the voltages in the electric power system are controlled by superposition of voltage control amounts by the voltage control devices.

The other means will be explained later in "Mode for Carrying Out the Invention".

Advantageous Effect of the Invention

According to the present invention, the voltage deviation of the whole electric power system can be reduced even in cases where the acquisition of the measurement values is limited by the restriction regarding the communication line.

BRIEF DESCRIPTION OF THE DRAWINGS

FIG. 6 is a schematic diagram showing the data structure of a measurement value table storing measurement values in the electric power system control system in accordance with the embodiment of the present invention.

MODE FOR CARRYING OUT THE INVENTION

Figure 1:
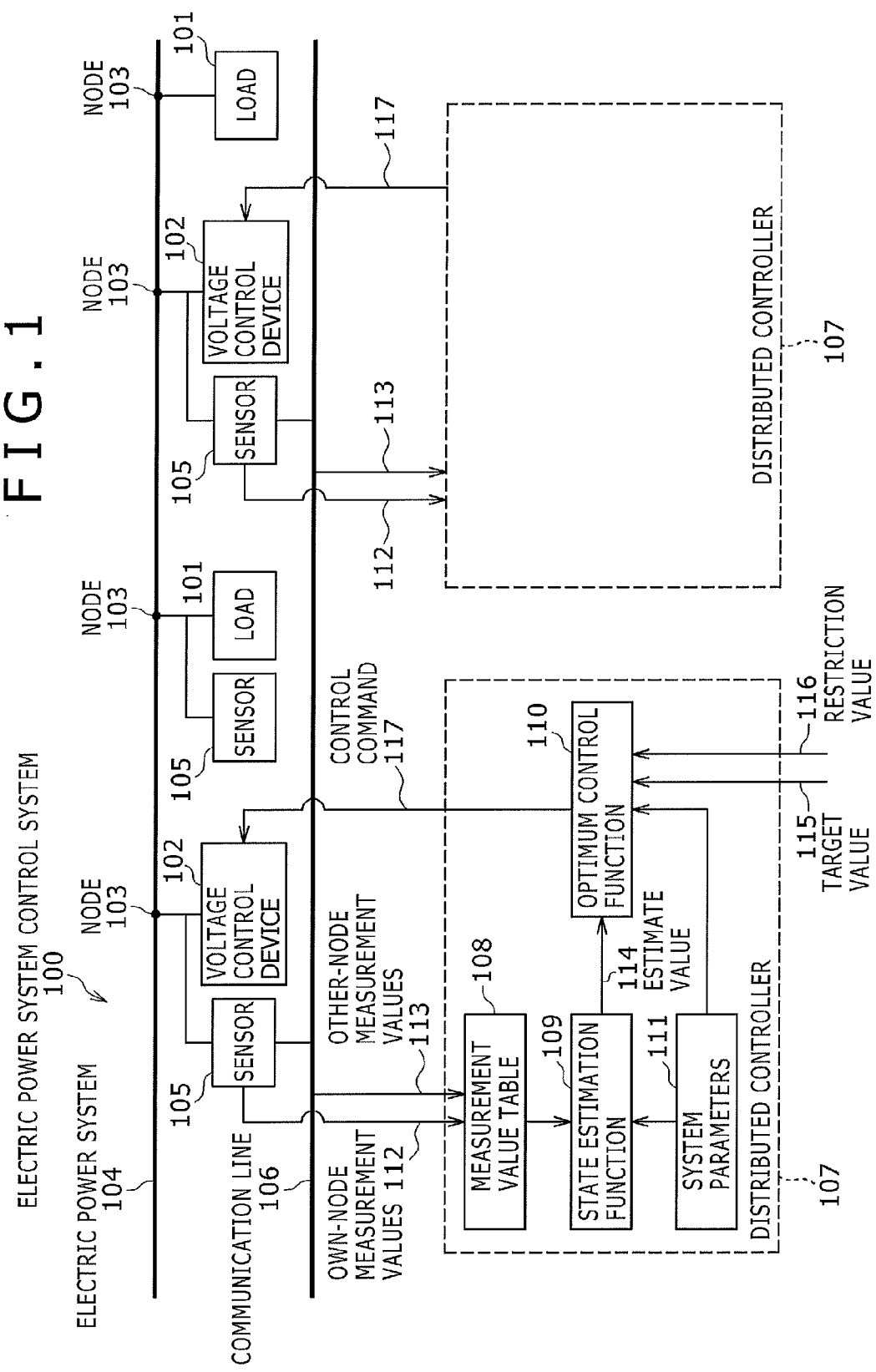
FIG. 1 is a schematic diagram showing an example of the configuration of an electric power system control system in accordance with an embodiment of the present invention.

Referring now to the drawings, a description will be given in detail of a mode for carrying out the invention (hereinafter referred to as an "embodiment").

Embodiment

An electric power system control system in accordance with an embodiment of the present invention will be explained below with reference to FIGS. 1-6.

Since a lot of concepts, definitions and mathematical equations are necessary for the explanation of the electric power system control system, items and the order of the explanation will be summarized first and thereafter each item will be explained in turn.

<Outline of Items and Order of Explanation>

First, the configuration of the electric power system control system will be explained by referring to FIG. 1.

Next, a mathematical model of the electric power system control system will be explained by referring to FIG. 2. The mathematical model will be explained while showing system topology and system parameters and using adjacency matrices (equations 1 and 2) and hierarchical matrices (equations 3A-3D and 4A-4D).

Next, the relationship between an observing node and observed nodes and notation of parameters of the nodes will be explained together with equations 5A and 5B. By using the notation, power equations (equations 6A and 6B) of a branch viewed from a node (including hierarchical matrices viewed from a distributed controller installed in the electric power system) will be explained.

Further, calculation of control sensitivity (equation 7), as a voltage change caused by an operation amount change of a node viewed from the distributed controller, from the power equations and the system topology will be explained.

Next, an explanation will be given of a power equation (equation 8) as an aggregated form of the power equations holding for the nodes in the whole electric power system and a measurement equation (equation 9) including the voltage and current measurement values of nodes acquired by each node.

Then, an explanation will be given of a matrix equation (equation 10) for obtaining an approximate solution that minimizes an error with respect to the power equations and an error with respect to the measurement values by solving a least square problem of the aggregated power equation and the measurement equation as simultaneous equations by a state estimation function of the distributed controller.

Since the aforementioned measurement values are under the restriction by the communication line, reliability matrices according to the measurement accuracy (equations 11 and 12) will be defined. Further, a weight coefficient matrix (equation 13) including a diagonalized reliability matrix regarding the reliability will be defined.

Then, this weight coefficient matrix is introduced into the aforementioned least square problem of the aggregated power equation and the measurement equation as simultaneous equations (equation 14), by which estimate values regarding the voltages and currents of the whole system with less errors are obtained (equation 15).

Then, an approximate solution that minimizes a deviation with respect to voltage target values and an error with respect to restriction values is obtained from a matrix equation (equation 18) by solving a least square problem in regard to a deviation equation regarding the voltage deviations (equation 16) and a restriction equation that places restriction on operation amounts (equation 17) by an optimum control function of the distributed controller. An explanation will be given also of the deviation equation and the restriction equation.

Next, an explanation will be given of weighting of the deviation equation with a priority matrix (equation 19, equation 20) which is conducted when an operation for eliminating the voltage deviation preferentially for sensitive loads is carried out in cases where the approximation error in the state estimation varies from node to node.

Further, for the restriction equation, a restriction degree matrix (equation 21) having values corresponding to the degree (strength) of restriction is set depending on each control device as a target of restriction. A diagonalized restriction degree matrix (equation 22) is extracted from the restriction degree matrix, and a weight coefficient matrix (equation 23) is formed by combining the diagonalized restriction degree matrix with a diagonalized priority matrix (equation 20) obtained from the aforementioned priority matrix. This weight coefficient matrix is introduced into a least square problem of the aforementioned deviation equation and restriction equation as simultaneous equations (equation 24), by which a solution more suiting the actual situation is obtained.

Next, an explanation will be given to show that the operation amount regarding the own node (node to which the distributed controller belongs) is obtained from the above solution and the control reducing the voltage deviation of the whole electric power system is realized by outputting and distributing the operation amount to the voltage control device as a control command.

Next, an explanation will be given to show that seamless transition among local control, distributed cooperative control and centralized control becomes possible by introducing a reliability matrix, a priority matrix and a restriction degree matrix (equations 16, 17 and 18) and properly selecting and setting the elements of these matrices.

Next, an explanation will be given also of a flow chart showing the operation of the electric power system control system in the above-described control and the data structure of a measurement value table.

<Configuration of Electric Power System Control System>

The configuration of the electric power system control system in accordance with the present invention will be described below.

FIG. 1 is a schematic diagram showing an example of the configuration of an electric power system control system 100 in accordance with an embodiment of the present invention.

In FIG. 1, the electric power system control system 100 comprises a plurality of loads 101 and voltage control devices 102 such as SVRs (Step Voltage Regulators (automatic voltage regulators)) and SVCs (Static Var Compensators (reactive power compensators)).

The electric power system control system 100 also comprises an electric power system 104 in which the loads and the voltage control devices are connected together via nodes 103, a plurality of sensors 105 installed in part or all of the nodes for measuring voltage and current, a communication line 106 used for collecting data from the sensors 105, and a plurality of distributed controllers 107 for controlling the aforementioned voltage control devices.

Each load 101 is connected to the electric power system 104 via a node 103. Specifically, the loads 101 are connected to the electric power system 104 in units of single customers in a high-voltage/low-voltage system, in units of distribution transformers (into each of which a plurality of low-voltage customers have been aggregated), or the like.

The voltage control devices 102 can include not only the special-purpose voltage control devices such as SVRs and SVCs but also devices for various purposes in high-voltage/low-voltage systems, such as a DMS (Distribution Management System (distribution voltage control system)) for controlling the power consumption of customers or a PCS (Power Conditioning System (power conditioner)) for controlling the output power of a solar battery. A DVR (Dynamic Voltage Restorer (instantaneous voltage compensation device)), a UPS (Uninterruptible Power Supply)) and/or a distribution transformer having the voltage regulation function can also be included in the voltage control devices. It is also possible to control the electric power of an electric vehicle, an electric water heater, an air conditioner, etc. (capable of receiving and outputting electric power according to charging plan settings for times of connection with the electric power system) by using a HEMS (Home Energy Management System) or the aforementioned DMS.

Each of the distributed controllers 107 has a measurement value table (measurement value data collection functional unit) 108, a state estimation function (state estimation functional unit) 109, an optimum control function 110 (optimum control functional unit), and system parameters 111. The system parameters 111 are used for setting the system topology and circuit impedance as known information.

Own-node measurement values 112 obtained by measurement at the own node (node to which the distributed controller 107 belongs) and other-node measurement values 113 obtained restrictively via the communication line 106 are stored in the measurement value table 108.

The state estimation function 109 receives measurement values stored in the measurement value table 108 and estimates each node voltage and each node current as state quantities of the electric power system by using the system parameters 111.

The optimum control function 110 appropriately distributes operation amounts to the voltage control devices so as to eliminate voltage deviation between an estimate value 114 and a target value 115 of the voltage control by using the estimate value 114 as the output of the state estimation function 109 and the aforementioned system parameters 111 and by referring to the target value 115 of the voltage control and a restriction value 116 (for setting restriction on the operation amount) inputted thereto. The optimum control function 110 outputs the operation amount regarding the own node to the voltage control device 102 as a control command 117.

<Mathematical Model of Electric Power System Control System>

A mathematical model of the electric power system control system 100 will be shown below.

In the mathematical model, the system topology which is set in the system parameters 111 is defined as explained below.

First, the node number of each element of the electric power system is set and the connective relationship among the nodes is expressed by adjacency matrices (upstream adjacency matrix U, downstream adjacency matrix D) and hierarchical matrices ($C_U$, $C_D$, $C_O$, $C_E$). Details will be explained in turn below.

<<Node Number>>

Figure 2:
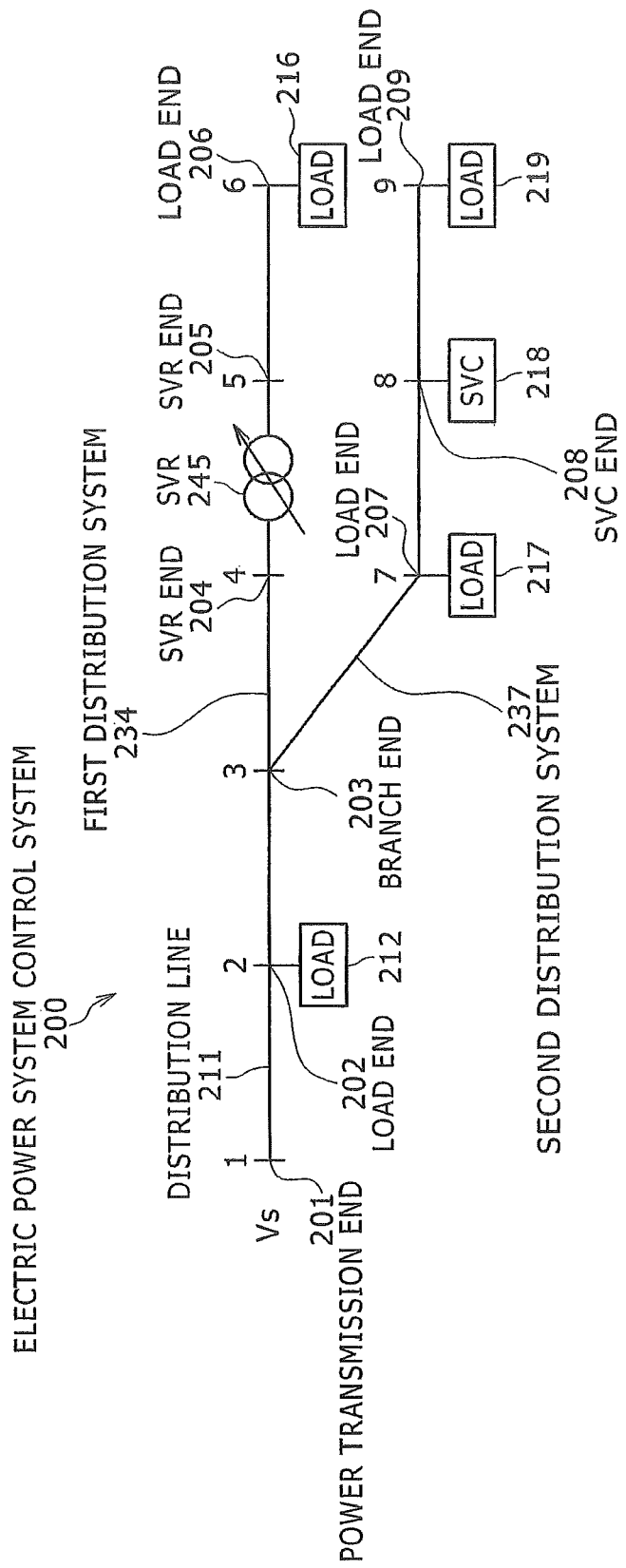
FIG. 2 is a schematic diagram showing an example of the configuration of each element of the electric power system control system in accordance with the embodiment of the present invention and an example of assignment of a node number to each element.

FIG. 2 is a schematic diagram showing an example of the configuration of each element of the electric power system control system in accordance with the embodiment of the present invention and an example of the assignment of the node number to each element.

FIG. 2 shows a state in which voltage $V_S$ is supplied from a power transmission end 201 to a distribution line 211 of an electric power system control system 200.

Incidentally, while the voltage $V_S$ as an AC (complex number) voltage vector is usually expressed with a dot (modifying symbol) attached over the character as shown in FIG. 2, the voltage $V_S$ in this description will be expressed without the dot for convenience of notation.

In the distribution line 211 as a mathematical model, there first is a load end 202 to which a load 212 is connected, and secondly, there is a branch end 203. The distribution line 211 branches at the branch end 203 into a first distribution system 234 and a second distribution system 237.

An SVR 245 is connected to the first distribution system 234. An SVR end 204 and an SVR end 205 exist on the input side and on the output side of the SVR 245, respectively. Arranged on the output side of the SVR end 205 is a load end 206 to which a load 216 is connected.

In the second distribution system 237 branching out from the branch end 203, there first is a load end 207 to which a load 217 is connected, and secondly, there is an SVC end 208 to which an SVC 218 is connected. Arranged beyond the SVC end 208 is a load end 209 to which a load 219 is connected.

As shown in FIG. 2, the node numbers are assigned to the power transmission end 201, the load end 202, the branch end 203, the SVR end 204, the SVR end 205, the load end 206, the load end 207, the SVC end 208 and the load end 209 successively from 1 to 9 as exclusive node numbers.

The connective relationship among the nodes is expressed by adjacency matrices and hierarchical matrices which will be explained below. The adjacency matrices will be explained first and thereafter the hierarchical matrices will be explained.

<<Adjacency Matrices>>

The adjacency matrices will be explained below.

Each adjacency matrix is defined as a mathematical representation of the connective relationship on the upstream side or the downstream side of the node. The side closer to the power transmission end is the upstream side, while the side farther from the power transmission end is the downstream side. An upstream adjacency matrix U and a downstream adjacency matrix D are defined for the upstream side and the downstream side, respectively. The upstream adjacency matrix U and the downstream adjacency matrix D will be explained in turn below.

<<Upstream Adjacency Matrix U>>

Each element $u_p$ of the upstream adjacency matrix U is defined as the upstream adjacent node (node number) of a node p. The following equations 1 is obtained by successively writing down the upstream adjacent node of each node from the node 1 (from the left end) according to the above definition and the example of FIG. 2 (0 indicates that there is no corresponding node):

$$U=[0\ 1\ 2\ 3\ 4\ 5\ 3\ 7\ 8] \qquad \text{(Equation 1)}$$

<<Downstream Adjacency Matrix D>>

Next, the downstream adjacency matrix D will be explained below.

Each element $d_{n,p}$ of the downstream adjacency matrix D is defined as the downstream adjacent node (node number) of the node p in the path reaching the node n (0 indicates that there is no corresponding node).

In contrast to the upstream adjacent node being uniquely determined for each node, the downstream adjacent node can vary due to the existence of a branch. In the example of FIG. 2, the downstream adjacent node of the node 3 differs between the path reaching the node 5 and the path reaching the node 8.

Further, in the eighth row and the ninth row of the equations 2 shown below, a representation "0, 0, 0" exits at the downstream adjacency matrix elements $d_{8,3}$ and $d_{8,7}$ corresponding to the node number 3 (represented as "7") and the node number 7 (represented as "8") and between the matrix elements $d_{9,3}$ and $d_{9,7}$ for the following reason: Although these matrix elements should originally correspond to the node numbers 4, 5 and 6, the nodes (4, 5, 6) do not exist in the paths reaching the node 7 or the node 8 in FIG. 2, and thus these matrix elements are represented as "0, 0, 0". Such matrix elements are defined as above for convenience of mathematical processing of this method.

The following matrix (equations 2) is obtained by writing down all the matrix elements for the example of FIG. 2 according to this definition:

$$D = \begin{bmatrix} 0 & 0 & 0 & 0 & 0 & 0 & 0 & 0 & 0 \\ 2 & 0 & 0 & 0 & 0 & 0 & 0 & 0 & 0 \\ 2 & 3 & 0 & 0 & 0 & 0 & 0 & 0 & 0 \\ 2 & 3 & 4 & 0 & 0 & 0 & 0 & 0 & 0 \\ 2 & 3 & 4 & 5 & 0 & 0 & 0 & 0 & 0 \\ 2 & 3 & 4 & 5 & 6 & 0 & 0 & 0 & 0 \\ 2 & 3 & 7 & 0 & 0 & 0 & 0 & 0 & 0 \\ 2 & 3 & 7 & 0 & 0 & 8 & 0 & 0 & 0 \\ 2 & 3 & 7 & 0 & 0 & 8 & 9 & 0 & 0 \end{bmatrix} \quad \text{(Equation 2)}$$

<<Hierarchical Matrices>>

The hierarchical matrices include four types of hierarchical matrices $C_U$, $C_D$, $C_O$ and $C_E$ as will be explained below. The hierarchical matrices $C_U$, $C_D$, $C_O$ and $C_E$ are defined respectively as matrices of equations 4A-4D based on relational equations 3A-3D which will be explained below.

The hierarchical matrices $C_U$, $C_D$, $C_O$ and $C_E$ are defined as mathematical representations indicating the connective relationship on the upstream side and the downstream side irrespective of whether the connection is adjacent or indirect. Each element $C_{Unp}$, $C_{Dnp}$, $C_{Onp}$, $C_{Enp}$ takes on a defined value (equations 3A-3D) according to the connective relationship.

The "parallel flow node" in the element $C_{Enp}$ defined in the equation 3D means a node that is in a parallel connective relationship via a branch end. In the example of FIG. 2, the node 5 viewed from the node 8 is a parallel flow node.

<<Each Element $C_{Unp}$, $C_{Dnp}$, $C_{Onp}$, $C_{Enp}$ of Hierarchical Matrices>>

Each element $C_{Unp}$, $C_{Dnp}$, $C_{Onp}$, $C_{Enp}$ of the hierarchical matrices will be explained in detail below.

The details of the definitions of the equations 3A-3D representing the elements $C_{Unp}$, $C_{Dnp}$, $C_{Onp}$ and $C_{Enp}$ are as follows:

$$C_{Unp} = \begin{cases} 1: \text{when } n \text{ is upstream-side node of } p \\ 0: \text{other cases} \end{cases} \quad \text{(Equation 3A)}$$

$$C_{Dnp} = \begin{cases} 1: \text{when } n \text{ is downstream-side node of } p \\ 0: \text{other cases} \end{cases} \quad \text{(Equation 3B)}$$

-continued $$C_{Onp} = \begin{cases} 1: \text{own node } (n = p) \\ 0: \text{other cases} \end{cases} \quad \text{(Equation 3C)}$$

$$C_{Enp} = \begin{cases} 1: \text{when } n \text{ is parallel flow node of } p \\ 0: \text{other cases} \end{cases} \quad \text{(Equation 3D)}$$

Matrices shown in the following equations 4A, 4B, 4C and 4D are obtained by writing down the above definitions of the hierarchical matrices according to the example of FIG. 2. The elements $C_{Unp}$, $C_{Dnp}$, $C_{Onp}$ and $C_{Enp}$ of the hierarchical matrices are exclusive of each other and the following relationship holds for arbitrary n and p:

$$C_{Unp} + C_{Dnp} + C_{Onp} + C_{Enp} = 1$$

$$C_U = \begin{bmatrix} 0 & 1 & 1 & 1 & 1 & 1 & 1 & 1 & 1 \\ 0 & 0 & 1 & 1 & 1 & 1 & 1 & 1 & 1 \\ 0 & 0 & 0 & 1 & 1 & 1 & 1 & 1 & 1 \\ 0 & 0 & 0 & 0 & 1 & 1 & 0 & 0 & 0 \\ 0 & 0 & 0 & 0 & 0 & 1 & 0 & 0 & 0 \\ 0 & 0 & 0 & 0 & 0 & 0 & 0 & 0 & 0 \\ 0 & 0 & 0 & 0 & 0 & 0 & 0 & 1 & 1 \\ 0 & 0 & 0 & 0 & 0 & 0 & 0 & 0 & 1 \\ 0 & 0 & 0 & 0 & 0 & 0 & 0 & 0 & 0 \end{bmatrix} \quad \text{(Equation 4A)}$$

$$C_D = \begin{bmatrix} 0 & 0 & 0 & 0 & 0 & 0 & 0 & 0 & 0 \\ 1 & 0 & 0 & 0 & 0 & 0 & 0 & 0 & 0 \\ 1 & 1 & 0 & 0 & 0 & 0 & 0 & 0 & 0 \\ 1 & 1 & 1 & 0 & 0 & 0 & 0 & 0 & 0 \\ 1 & 1 & 1 & 1 & 0 & 0 & 0 & 0 & 0 \\ 1 & 1 & 1 & 1 & 1 & 0 & 0 & 0 & 0 \\ 1 & 1 & 1 & 0 & 0 & 0 & 0 & 0 & 0 \\ 1 & 1 & 1 & 0 & 0 & 0 & 1 & 0 & 0 \\ 1 & 1 & 1 & 0 & 0 & 0 & 1 & 1 & 0 \end{bmatrix} \quad \text{(Equation 4B)}$$

$$C_O = \begin{bmatrix} 1 & 0 & 0 & 0 & 0 & 0 & 0 & 0 & 0 \\ 0 & 1 & 0 & 0 & 0 & 0 & 0 & 0 & 0 \\ 0 & 0 & 1 & 0 & 0 & 0 & 0 & 0 & 0 \\ 0 & 0 & 0 & 1 & 0 & 0 & 0 & 0 & 0 \\ 0 & 0 & 0 & 0 & 1 & 0 & 0 & 0 & 0 \\ 0 & 0 & 0 & 0 & 0 & 1 & 0 & 0 & 0 \\ 0 & 0 & 0 & 0 & 0 & 0 & 1 & 0 & 0 \\ 0 & 0 & 0 & 0 & 0 & 0 & 0 & 1 & 0 \\ 0 & 0 & 0 & 0 & 0 & 0 & 0 & 0 & 1 \end{bmatrix} \quad \text{(Equation 4C)}$$

$$C_E = \begin{bmatrix} 0 & 0 & 0 & 0 & 0 & 0 & 0 & 0 & 0 \\ 0 & 0 & 0 & 0 & 0 & 0 & 0 & 0 & 0 \\ 0 & 0 & 0 & 0 & 0 & 0 & 0 & 0 & 0 \\ 0 & 0 & 0 & 0 & 0 & 1 & 1 & 1 \\ 0 & 0 & 0 & 0 & 0 & 0 & 1 & 1 & 1 \\ 0 & 0 & 0 & 0 & 0 & 0 & 1 & 1 & 1 \\ 0 & 0 & 0 & 1 & 1 & 1 & 0 & 0 & 0 \\ 0 & 0 & 0 & 1 & 1 & 1 & 0 & 0 & 0 \\ 0 & 0 & 0 & 1 & 1 & 1 & 0 & 0 & 0 \end{bmatrix} \quad \text{(Equation 4D)}$$

While the downstream adjacency matrix and the hierarchical matrices are redundant representations of the upstream adjacency matrix, they are representations often used for describing a mathematical model and are invariable constants as long as the topology of the distribution system does not change. Therefore, the aforementioned upstream adjacency matrix, downstream adjacency matrix and hierarchical matrices can previously be generated when a distributed controller 107 (FIG. 1) is installed in the electric power system control system 100.

In the following explanation, the symbols $u_p$, $d_{np}$, $C_{Unp}$, $C_{Dnp}$, $C_{Onp}$ and $C_{Enp}$ can be expressed as $u(p)$, $d(n,p)$, $C_U(n,p)$, $C_D(n,p)$, $C_O(n,p)$ and $C_E(n,p)$ as needed for better viewability of the descriptions of the mathematical model.

<<Measurement Values Dependent on Relationship Between Observing Node and Observed Node>>

Due to the presence/absence of a communication line and the restriction on the bandwidth, the measurement values of the sensors 105 acquired via the communication line 106 (FIG. 1) differ in the updating cycle and the resolution depending on the arrangement of the nodes 103. This means that the acquired measurement value varies depending on the observing node (i) even if the observed node (p) is the same. The acquisition of the measurement values of other nodes is dependent on the status of the communication line 106 between nodes.

Specifically, the following statuses can be assumed in descending order of accuracy:

(the measurement value can be acquired in real time via a communication line of a sufficient bandwidth)>

(time delay or discretization error occurs to the measurement value due to communication band insufficiency)>

(the measurement value cannot be acquired but can be substituted with a statistical value or a rated value)>

(there exists no measurement value or substitute value)

The voltage and the current varying depending on the relationship between the observing node and the observed node as above are expressed as matrices as shown in the following equations 5A and 5B:

Incidentally, while the voltage $V_{ip}$ and the current $I_{ip}$ as AC (complex number) vector notations are usually expressed with a dot (modifying symbol) attached over each character as shown in the equations 5A and 5B, the voltage $V_{ip}$ and the current $I_{ip}$ in this explanation will be expressed without the dot for convenience of notation.

The voltage $V_{ip}$ and the current $I_{ip}$ as AC (complex number) vector notations are the node voltage and the node current of the node p viewed from the node i ($1 \le i \le N$, $1 \le p \le N$).

The voltage $V_i$ and the current $I_{ip}$ are the internal state of (internal state information on) the node p that is held by the distributed controller 107 of the node i. The node current $I_{ip}$, is not the total current flowing through the node. The node current $I_{ip}$ indicates the current flowing into or out of the load or SVC of the node (see FIG. 3 which will be explained later).

The number N represents the total number of nodes.

$$\dot{V} = \begin{bmatrix} \dot{V}_{11} & \cdots & \dot{V}_{1N} \\ \vdots & \ddots & \vdots \\ \dot{V}_{N1} & \cdots & \dot{V}_{NN} \end{bmatrix}$$ (Equation 5A)

$$\dot{I} = \begin{bmatrix} \dot{I}_{11} & \cdots & \dot{I}_{1N} \\ \vdots & \ddots & \vdots \\ \dot{I}_{N1} & \cdots & \dot{I}_{NN} \end{bmatrix}$$ (Equatioin 5B)

In the above expression "the node voltage of the node p viewed from the node i", "viewed from" is used because the node voltage at the node p is not necessarily the same information for each node as mentioned above.

Specifically, even though the node voltage at the node p measured by the node p itself is a generally precise value at the point of measurement, the information on the node voltage of the node p held by another node is information dependent on the communication line since the information has been acquired via the communication line 106.

Thus, as mentioned above, there are cases where the information (on the node voltage of the node p held by another node) is information on a time in the past, the information has a discretization error, the information has been substituted with a statistical value or a rated value, or there exists no information in the first place. To sum up, the expression "the node voltage of the node p viewed from the node i" is equivalent to "information on the node voltage of the node p that is held by the node i".

<<Parameter Notation Regarding SVRs and SVCs>>

Power equations viewed from the distributed controller 107 of the node i will be described later based on the representations of the voltage and the current defined by the above equations 5A and 5B. Prior to the explanation of the power equations, notation of parameters, etc. regarding the SVRs and the SVCs will be explained first.

Figure 3:
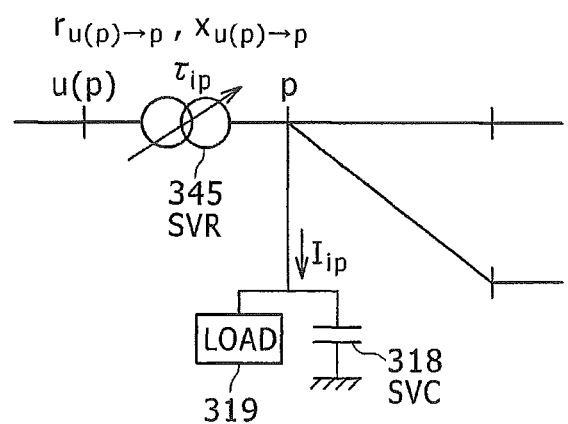
FIG. 3 is a schematic diagram showing the notation of parameters, etc. regarding SVRs and SVCs in the electric power system control system in accordance with the embodiment of the present invention.
Figure 4:
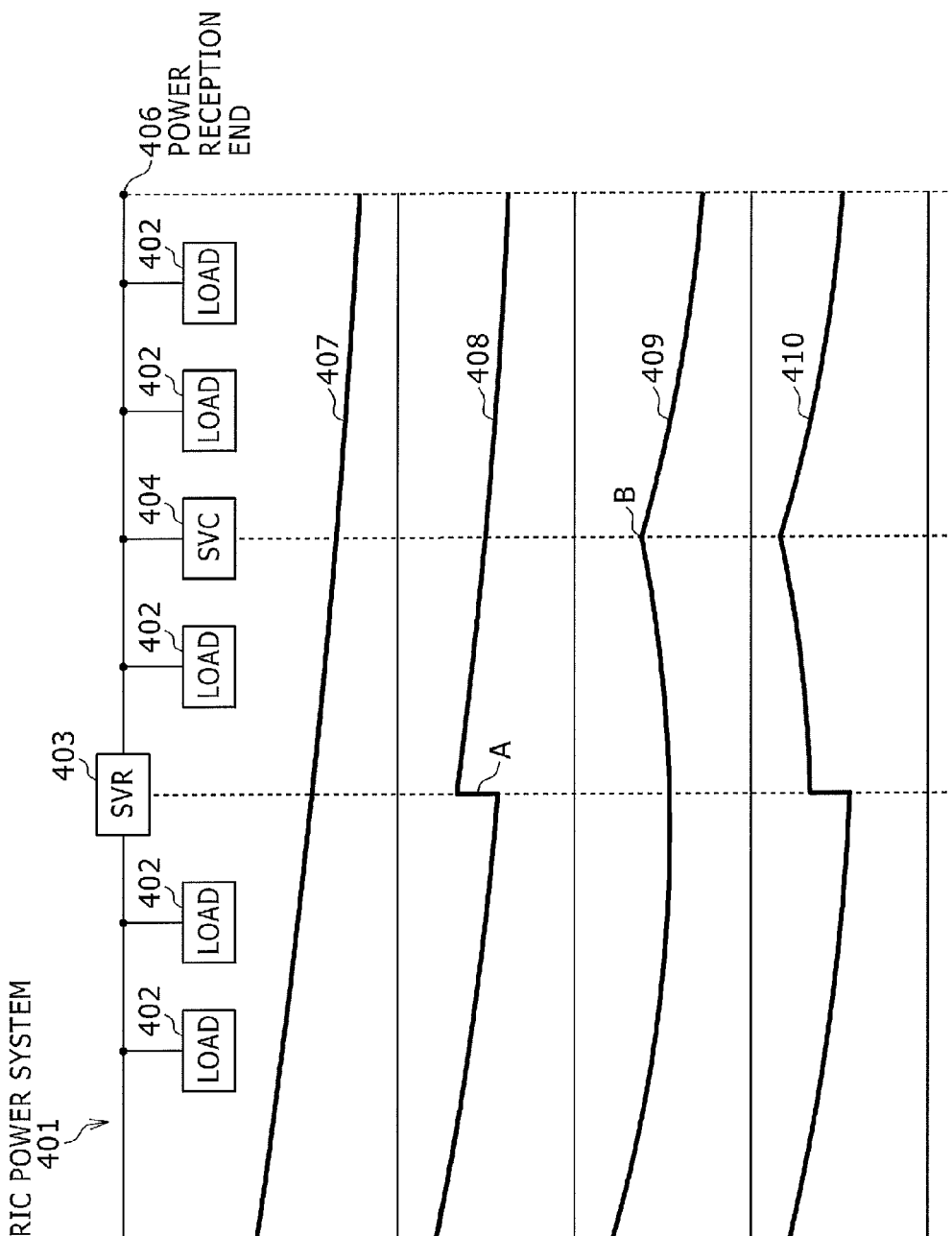
FIGS. 4A to 4E are schematic diagrams showing an example of a situation in which the voltage of a distribution system is controlled by superposition of voltage change amounts caused by voltage control devices of the electric power system control system in accordance with the embodiment of the present invention.

FIG. 3 is a schematic diagram showing the notation of parameters, etc. regarding the SVRs and the SVCs in the electric power system control system in accordance with the embodiment of the present invention.

In FIG. 3, an SVR 345 is provided between a node p and an upper node u(p) adjacent to the node p. The voltage regulation tap ratio of the SVR 345 viewed from the node i is expressed as $\tau_{ip}$.

Assuming that the SVR 345 is absent, the resistance component of the impedance of a branch between the node u(p) and the node p is expressed as $\tau_{u(p) \to p}$ and the reactance component of the impedance is expressed as $x_{u(p) \to p}$.

Assuming that a load 319 and an SVC 318 are connected to the node p, the current flowing into or out of the load 319 or the SVC 318 of the node p, viewed from the node i, is expressed as $I_{ip}$.

Incidentally, while the SVC 318 in FIG. 3 is indicated by a symbol of an ordinary type of capacitor, the SVC 318 also has a function of feeding not only the leading current but also the lagging current through the capacitor.

<<Power Equations of Branch>>

Next, the power equations of a branch (equations 6A and 6B) will be explained below. The power equations are relational expressions that hold between adjacent nodes (u(p), p). Incidentally, an element connecting between adjacent nodes is called a "branch". The node p can either be upstream of the node i or downstream of the node i.

In the equation 6A shown below, in addition to the voltage $V_{ip}$ and the current $I_{ip}$ of the node p viewed from the node i, the voltage of a node that is one node upstream of the node p is expressed as $V_{iu(p)}$.

In regard to the node current $I_{in}$ of any downstream-side node n, the passing current flowing through the node p is expressed as $I'_{in(p)}$.

As notation for circuit impedance that is set in the system parameters 111, the branch (corresponding to a distribution line) from the adjacent node u(p) to the node p is expressed as a subscript u(p)→p as mentioned above.

Specifically, the resistance component and the reactance component of the impedance is expressed as $\tau_{u(p) \to p}$ and $x_{u(p) \to p}$, respectively, and the impedance is expressed as $\tau_{u(p) \to p} + jx_{u(p) \to p}$.

The character $\tau_{ip}$ represents the SVR tap ratio of the node p viewed from the node i as mentioned above.

Incidentally, while the voltages $V_{ip}$ and $V_{iu(p)}$ and the currents $I_{ip}$, $I'_{in(p)}$ and $I_{in}$ as AC (complex number) vectors are expressed with the dot (modifying symbol) over each character in the equations 6A and 6B, these AC (complex number) vectors in this explanation are expressed without the dot for convenience of notation as mentioned above.

While each node has been set exclusively as an SVR end, an SVC end, a load end or a branch end, if these types of ends are generalized as shown in FIG. 3 explained above, the power equations of the branch u(p)→p viewed from the node i can be expressed as the following equations 6A and 6B based on the relationship among the voltage, current and impedance: As a supplementary explanation of the SVR tap ratio, $\tau_{ip}$ equals 1 at each node not equipped with the SVR. It is also possible to describe a distribution transformer between high-voltage/low-voltage systems by setting $\tau_{ip}$ at a fixed transformation ratio.

$$\dot{V}_{ip} = \tau_{ip}\dot{V}_{iu(p)} - (r_{u(p)\to p} + jx_{u(p)\to p})\left(\dot{I}_{ip} + \sum_{n=1}^{N} C_D(n, p)\dot{I}'_{in}(p)\right) \quad \text{(Equation 6A)}$$

where:

$$\dot{I}'_{in}(p) = (\tau_{id(n,p)} \times \tau_{id(n,d(n,p))} \times \ldots \times \tau_{in})\dot{I}_{in} \quad \text{(Equation 6B)}$$

In the equation 6A, the term including the coefficient $\tau_{ip}$ relates to SVRs and distribution transformers, and the term including $I'_{in(p)}$ relates to SVCs and loads.

In the equation 6B, d(n,p) in the subscript of $\tau$ represents the element $d_{np}$ of the downstream adjacency matrix D as mentioned above, and d(n,d(n,p)) represents the relationship between n and d(n,p), successively going downstream.

<<Control Sensitivity K(i)>>

If the operation amount of each voltage control device 102 (SVR tap ratio or SVC current) is changed in the above equations 6A and 6B, the voltage of each node 103 changes according to the power equations 6A and 6B.

In the mathematical model, control sensitivity K(i), representing the voltage change of the node n due to the operation amount change of the node p (viewed from the distributed controller 107 of the node i), is expressed as matrix notation $K(i)_{np}$.

The control sensitivity K(i) in the matrix notation is shown in the following equation 7:

$$K(i) = \begin{bmatrix} K(i)_{11} & \cdots & K(i)_{1N} \\ \vdots & \ddots & \vdots \\ K(i)_{N1} & \cdots & K(i)_{NN} \end{bmatrix} \quad \text{(Equation 7)}$$

In the above equation 7, $K(i)_{np}$ equals $\partial V_{in}/\partial \tau_{ip}$ in regard to SVRs and equals $\partial V_{in}/\partial I_{ip}$ in regard to SVCs.

$K(i)_{np}$ equals 0 at each node not equipped with a voltage control device.

Specific values of the matrix elements of the control sensitivity K(i) are calculated from the system topology (the adjacency matrices U and D and the hierarchical matrices $C_U$, $C_D$, $C_O$ and $C_E$) and the power equations 6A and 6B. Detailed explanation of the process for solving the equations is omitted here.

<<Aggregated Power Equation>>

The state estimation function 109 (FIG. 1) estimates each node voltage and each node current as state quantities of the electric power system by solving a least square problem regarding the power equations and a measurement equation.

In regard to the power equations, the linear equations regarding the voltage and the current of the branch u(p)→p described in the equations 6A and 6B hold for any combination of adjacent nodes.

Thus, the number of equations is N−1 when the number of nodes is N. In aggregated notation, the equations can be expressed as a matrix equation as shown in the following equation:

$$A(i)\begin{bmatrix} \dot{V}_{i1} \\ \vdots \\ \dot{V}_{iN} \\ \dot{I}_{i1} \\ \vdots \\ \dot{I}_{iN} \end{bmatrix} = \begin{bmatrix} \dot{V}_S \\ 0_{N-1} \end{bmatrix} \quad \text{(Equation 8)}$$

A (i) in the above equation 8 is a coefficient matrix regarding the distributed controller of the node i which is made up of the impedance $\tau_{u(p)\to p}$, $x_{u(p)\to p}$, the tap ratio $\tau_{ip}$ and the hierarchical matrix $C_D(n,p)$ in the power equations 6A and 6B of the branch. The first row describes a constraint condition $V_{i1}=V_S$ regarding the transmission voltage $V_S$ of the power transmission end node. By using the transmission voltage $V_S$ of the power transmission end node as the reference, the elements ($V_{i1}, \ldots, V_{iN}$) are calculated and described based on the voltage drop.

On the right side of the equation, a column vector made up of (N−1) zeros ($0_{N-1}$) exists under $V_S$.

Since 2N variables ($V_{i1}, \ldots, V_{iN}, I_{i1}, \ldots, I_{iN}$) exist for these elements, the size of the matrix A (i) is N rows×2N columns (N×2N coefficient matrix).

The coefficient elements of the matrix A (i) include zeros. For example, in the first row of A (i), the leftmost coefficient is 1 and the other coefficients situated to the right are all 0.

While the impedance and the hierarchical matrix $C_D(n,p)$ set in the system parameters 111 are known constants, the coefficient matrix A (i) varies with time since A (i) includes the adjusted tap ratio $\tau_{ip}$ of the SVR. Since every item of the equation 6A includes either $V_{ip}$ or $I_{ip}$, the right side of the equation 8 is a vector made up of zeros except for the first element as mentioned above.

<<Measurement Equation>>

In regard to the measurement equation, the following equation 9 holds, or is desired to hold, for the voltage and current measurement values $V_{ip}$ and $I_{ip}$ of the node p obtained by the node i (i.e., the own-node measurement values 112 and the other-node measurement values 113 obtained restrictively via the communication line).

Thus, while the left side and the right side of the equation 9 are connected by the equal sign "=", the equality "=" does not necessarily hold; the equation 9 corresponds to a conditional expression that should be solved while maintaining the equality as precisely as possible. Incidentally, the solution to be obtained from the equation 9 is ($V_{i1}, \ldots, V_{iN}$, $I_{i1}, \ldots, I_{iN}$) with the dot (modifying symbol) over each character.

$$I_{2N} \begin{bmatrix} \dot{V}_{i1} \\ \vdots \\ \dot{V}_{iN} \\ \dot{I}_{i1} \\ \vdots \\ \dot{I}_{iN} \end{bmatrix} = \begin{bmatrix} \tilde{V}_{i1} \\ \vdots \\ \tilde{V}_{iN} \\ \tilde{I}_{i1} \\ \vdots \\ \tilde{I}_{iN} \end{bmatrix} \quad \text{(Equation 9)}$$

In the equation 9, $I_{2N}$ on the left side represents a 2N×2N diagonal matrix whose diagonal elements are all 1 and whose non-diagonal elements are all 0.

On the left side, $(V_{i1}, \ldots, V_{iN}, I_{i1}, \ldots, I_{iN})$ with the dot (as the modifying symbol representing an AC (complex number) vector) over each character represents the voltage/current internal state of (voltage/current internal state information on) each node that is held by the distributed controller 107.

On the right side, $(V_{i1}, \ldots, V_{iN}, I_{i1}, \ldots, I_{iN})$ with the modifying symbol "~" over each character represents the measurement values (actual measurement values, estimate values, substitute values, etc.) as mentioned above.

<<Approximate Solution of Least Square Problem>>

By solving the least square problem of the equations 8 and 9 as simultaneous equations, an approximate solution that minimizes an error with respect to the power equation and an error with respect to the measurement values is obtained. The approximate solution can be obtained by solving the matrix equation shown in the following equation 10:

$$\begin{bmatrix} A(i) \\ I_{2N} \end{bmatrix} \begin{bmatrix} \dot{V}_{i1} \\ \vdots \\ \dot{V}_{iN} \\ \dot{I}_{i1} \\ \vdots \\ \dot{I}_{iN} \end{bmatrix} = \begin{bmatrix} \dot{V}_S \\ 0_{N-1} \\ \tilde{V}_{i1} \\ \vdots \\ \tilde{V}_{iN} \\ \tilde{I}_{i1} \\ \vdots \\ \tilde{I}_{iN} \end{bmatrix} \quad \text{(Equation 10)}$$

The right side of the equation 10 includes N elements ($\dot{V}_S$ and $0_{N-1}$) plus N elements (voltage measurement values $V_{i1}, \ldots, V_{iN}$ with the modifying symbol "~" over each character) plus N elements (current measurement values $I_{i1}, \ldots, I_{iN}$ with the modifying symbol "~" over each character). Thus, the equation 10 is made up of 3N equations.

On the other hand, the left side of the equation 10 includes 2N variables since there are N complex vector representations $V_{i1}, \ldots, V_{iN}$ and N complex vector representations $I_{i1}, \ldots, I_{iN}$ with the dot (modifying symbol) over each character.

Thus, the matrix equation 10 can be solved generally as an over-constrained problem since 2N variables exist for 3N equations.

Incidentally, the right side of the equation 10 and the coefficient matrix A(i) and the unit matrix (diagonal matrix) $I_{2N}$ on the left side of the equation 10 are known values.

By solving the above matrix equation 10 as an over-constrained problem, the voltage deviation of the whole electric power system can be reduced.

Detailed explanation of the process for solving the matrix equation 10 as an over-constrained problem is omitted here.

<More Reliable Solution Method by Introducing Reliability of Measurement Accuracy>

The aforementioned measurement values in the above equation 10 are not necessarily real-time measurement values since they are under the restriction by the communication line. Thus, there is no guarantee that the solution $(V_{i1}, \ldots, V_{iN}, I_{i1}, \ldots, I_{iN})$ obtained from the equation 10 is the optimum solution minimizing the voltage deviation of the whole electric power system.

Therefore, a method for further reducing the voltage deviation of the whole electric power system by obtaining a more reliable solution by introducing a reliability matrix W corresponding to the measurement accuracy will be explained below.

<<Reliability Matrix W>>

A more reliable solution is obtained by defining the reliability matrix W corresponding to the measurement accuracy as shown in the following equation 11 and assigning weights to the equation 10:

$$W = \begin{bmatrix} W_{11} & \ldots & W_{1N} \\ \vdots & \ddots & \vdots \\ W_{N1} & \ldots & W_{NN} \end{bmatrix} \quad \text{(Equation 11)}$$

Each element $W_{ip}$ of the reliability matrix shown in the equation 11 represents the reliability of the node p viewed from the node i (smaller value represents higher accuracy of the measurement value). Rows in regard to the node i are extracted from the reliability matrix W and formed into a diagonalized reliability matrix $W_d(i)$ as the matrix to be used for the weighting of the equation 10.

Incidentally, the diagonalized reliability matrix $W_d(i)$ is an N×N matrix having its elements only on the diagonal line (non-diagonal elements are all 0).

$$W_d(i) = \text{diag}([W_{i1} \ldots W_{iN}]) \quad \text{(Equation 12)}$$

<<Weight Coefficient Matrix H(i)>>

In order to weight the equation 10 with the reliability, a weight coefficient matrix H(i) including the diagonalized reliability matrices $W_d(i)$ as shown in the following equation 13 is generated first:

$$H(i) = \begin{bmatrix} I_N & & 0 \\ & W_d(i) & \\ 0 & & W_d(i) \end{bmatrix} \quad \text{(Equation 13)}$$

In the above equation 13, $I_N$ on the right side represents an N×N diagonal matrix whose diagonal elements are all 1 and whose non-diagonal elements are all 0.

Each diagonalized reliability matrix $W_d(i)$ on the right side is the aforementioned N×N matrix having its elements only on the diagonal line (non-diagonal elements are all 0). Two diagonalized reliability matrices $W_d(i)$ exist in the weight coefficient matrix H(i).

Therefore, the right side of the equation 13 represents a 3N×3N diagonal matrix whose diagonal elements are 1's and the elements of $W_d(i)$ and whose non-diagonal elements are all 0. This is the configuration of the weight coefficient matrix H(i) as the notation on the left side of the equation 13.

<<Weighted Least Square Problem>>

The following equation 14 is obtained by multiplying both sides of the equation 10 by the weight coefficient matrix H(i) (shown in the above equation 13) from the left:

$$H(i)\begin{bmatrix}A(i)\\I_{2N}\end{bmatrix}\begin{bmatrix}\dot{V}_{i1}\\\vdots\\\dot{V}_{iN}\\\dot{I}_{i1}\\\vdots\\\dot{I}_{iN}\end{bmatrix} = H(i)\begin{bmatrix}\dot{V}_S\\0_{N-1}\\\tilde{V}_{i1}\\\vdots\\\tilde{V}_{iN}\\\tilde{I}_{i1}\\\vdots\\\tilde{I}_{iN}\end{bmatrix} \quad \text{(Equation 14)}$$

The above equation 14 represents an operation of weighting each equation constituting the equation 10 with a diagonal element (weight coefficient) of the weight coefficient matrix H(i). The solution of the equation 14 as the weighted least square problem is given by the following equation:

$$\begin{bmatrix}\dot{V}_{i1}\\\vdots\\\dot{V}_{iN}\\\dot{I}_{i1}\\\vdots\\\dot{I}_{iN}\end{bmatrix} = \left(\begin{bmatrix}A(i)\\I_{2N}\end{bmatrix}^T H(i)^2 \begin{bmatrix}A(i)\\I_{2N}\end{bmatrix}\right)^{-1} \begin{bmatrix}A(i)\\I_{2N}\end{bmatrix}^T H(i)^2 \begin{bmatrix}\dot{V}_S\\0_{N-1}\\\tilde{V}_{i1}\\\vdots\\\tilde{V}_{iN}\\\tilde{I}_{i1}\\\vdots\\\tilde{I}_{iN}\end{bmatrix} \quad \text{(Equation 15)}$$

In the above equation 15, $(V_{i1}, \ldots, V_{iN}, I_{i1}, \ldots, I_{iN})$ on the left side, with the dot (as the modifying symbol for the complex vector notation) over each character, represents the estimate values 114 regarding the voltages and the currents of the whole system obtained by the distributed controller 107 of the node i. Incidentally, all the elements on the right side of the equation 15 are known values.

The above solution obtained from the equation 15 is the more reliable solution through the introduction of the measurement accuracy under the restriction by the communication line. By use of the more reliable solution, the voltage deviation of the whole electric power system can be reduced further.

<Least Square Problem Regarding Deviation Equation and Restriction Equation by Optimum Control Function>

In cases where there exist multiple methods (solutions) for reducing the voltage deviation of the whole electric power system, the operation amount of each voltage control device 102 is generally desired to be small. This is because increasing the operation amount of each voltage control device 102 (in order to reduce the voltage deviation of the whole electric power system) requires surplus electric power. Therefore, it is required not only to simply reduce the voltage deviation of the whole electric power system but also to consider optimum distribution of the operation amounts to the voltage control devices 102.

Next, an explanation will be given of a method employed by the optimum control function 110 (FIG. 1) for determining the optimum distribution of the operation amounts to the voltage control devices 102 by solving a least square problem in regard to a deviation equation regarding the voltage deviation and a restriction equation placing restriction (e.g., suppression or fixation of the operation amount of each voltage control device) and then distributing the operation amounts according to the optimum distribution.

First, the deviation equation regarding the voltage deviation will be explained below.

<<Deviation Equation>>

The deviation equation regarding the voltage deviation describes the deviation $\Delta V_{in}$ of the estimate value $V_{in}$ (estimate value 114 in FIG. 1) from the target value $V_{refn}$ of each node voltage (target value 115 in FIG. 1) by use of the control sensitivity matrix K(i) and the operation amount $\Delta f_{ip}$ of each voltage control device as shown in the following equation 16:

Incidentally, while the deviations $\lambda V_{i1}, \ldots, \Delta V_{iN}$ in the equation 16 are expressed with the dot (modifying symbol for the complex vector notation) over each character, the dot is omitted in this explanation for convenience of notation.

$$\begin{bmatrix}\Delta \dot{V}_{i1}\\\vdots\\\Delta \dot{V}_{iN}\end{bmatrix} = K(i)\begin{bmatrix}\Delta f_{i1}\\\vdots\\\Delta f_{iN}\end{bmatrix} \quad \text{(Equation 16)}$$

<<Restriction Equation>>

In regard to the restriction equation regarding the operation amount of each voltage control device, a restriction value $\Delta f_{refp}$ (restriction value 116 in FIG. 1) is set for the operation amount $\Delta f_{ip}$ of each voltage control device. For example, in order to fix the tap position of the SVR, the restriction value $\Delta f_{refp}$ is set as $\Delta f_{refp}=0$. In order to suppress the output of the SVC, the restriction value $\Delta f_{refp}$ is set corresponding to the node current estimate value $I_{ip}$ of the SVC end as $\Delta f_{refp}=-I_{ip}$. By describing such restriction as a matrix equation in conformity with the equation 16, the following equation 17 is obtained:

On the left side of the equation 17, $I_N$ represents an N×N unit matrix in which the diagonal elements are all 1 and the other elements are all 0.

$$I_N\begin{bmatrix}\Delta f_{i1}\\\vdots\\\Delta f_{iN}\end{bmatrix} = \begin{bmatrix}\Delta f_{ref1}\\\vdots\\\Delta f_{refN}\end{bmatrix} \quad \text{(Equation 17)}$$

<<Least Square Problem of Deviation Equation and Restriction Equation>>

By solving the least square problem of the equations 16 and 17 as simultaneous equations, an approximate solution that minimizes the deviations with respect to the voltage target values and the errors with respect to the restriction values is obtained. The approximate solution is obtained by solving the matrix equation shown in the following equation 18:

$$\begin{bmatrix}K(i)\\I_N\end{bmatrix}\begin{bmatrix}\Delta f_{i1}\\\vdots\\\Delta f_{iN}\end{bmatrix} = \begin{bmatrix}\Delta \dot{V}_{i1}\\\vdots\\\Delta \dot{V}_{iN}\\\Delta f_{ref1}\\\vdots\\\Delta f_{refN}\end{bmatrix} \quad \text{(Equation 18)}$$

In the above equation 18, $\Delta V_{i1}, \ldots, \Delta V_{iN}$ (the deviations $\Delta V_{ip}$ of the estimate values $V_{in}$) are N known values and $\Delta f_{ref1}, \ldots, \Delta f_{refN}$ (the restriction values $\Delta f_{refp}$) are also N known values, and thus the right side of the equation 18 is made up of 2N known values.

On the other hand, $\Delta f_{i1}, \ldots, \Delta f_{iN}$ (the operation amounts $\Delta f_{ip}$ of the voltage control devices) are N unknown values.

Thus, the equation (matrix equation) 18, including N variables for 2N equations, can be solved generally as an over-constrained problem.

By solving the over-constrained problem of the above matrix equation 18, a solution and control, taking the voltage deviation (obtained by the optimum control function 110) and the operation amount of each voltage control device into consideration, can be achieved.

Detailed explanation of the process for solving the matrix equation 18 as an over-constrained problem is omitted here.

<Method for Eliminating Voltage Deviation Preferentially for Loads Sensitive to Voltage Fluctuation>

In the process of solving the above matrix equation 18, in cases where the approximation error in the state estimation varies from node to node, the degree of necessity of eliminating the voltage deviation in regard to estimate values having great errors is low.

Therefore, it is possible to employ an operation that eliminates the voltage deviation preferentially for loads sensitive to voltage fluctuation. Thus, an explanation will be given below of a method for further weighting the deviation equations included in the equation 18 with a priority matrix that takes the priority of each node into consideration.

<<Priority Matrix L, $L_d(i)$>>

A method for introducing the priority matrix L will be explained below.

The priority matrix L is shown in the following equation 19:

$$L = \begin{bmatrix} L_{11} & \cdots & L_{1N} \\ \vdots & \ddots & \vdots \\ L_{N1} & \cdots & L_{NN} \end{bmatrix} \quad \text{(Equation 19)}$$

In the priority matrix L in the above equation 19, $L_{ip}$ represents the priority of the node p viewed from the node i.

With the increase in the value of $L_{ip}$, the priority of the control increases and the voltage deviation is eliminated more preferentially. In contrast, setting the priority $L_{ip}$ at a low value corresponds to not taking the voltage deviation of the node into consideration in the control.

In order to use the priority matrix L of the equation 19 for the weighting of the equation 18, rows in regard to the node i are extracted from the priority matrix L and formed into a diagonalized priority matrix $L_d(i)$. The diagonalized priority matrix $L_d(i)$ is shown in the following equation 20:

$$L_d(i) = \text{diag}([L_{i1} \ldots L_{iN}]) \quad \text{(Equation 20)}$$

<<Restriction Degree Matrix R, $R_d(i)$>>

Next, a restriction degree matrix R will be explained below.

The regulating capability of each voltage control device (SVR, SVC, etc.) for controlling the electric power system is under the restriction (e.g., fixation) mentioned above. The process of the solution by introducing the restriction equation according to the restriction is as explained above referring to the equations 16, 17 and 18.

However, there are cases where the degree of the restriction varies from voltage control device to voltage control device. In other words, there are cases where it is required to calculate the operation amounts so that errors with respect to restriction values of severer restriction (highly restrictive restriction values) become smaller.

In such cases, for the restriction equation, a restriction degree matrix R made up of restriction degrees representing the degree of restriction is set as shown in the following equation 21 depending on each control device as a target of restriction.

$$R = \begin{bmatrix} R_{11} & \cdots & R_{1N} \\ \vdots & \ddots & \vdots \\ R_{N1} & \cdots & R_{NN} \end{bmatrix} \quad \text{(Equation 21)}$$

In the above equation 21, $R_{ip}$ represents the degree of restriction regarding the control device of the node p viewed from the node i. The restriction degree $R_{ip}$ is set at a value corresponding to the strength of the restriction. In order to use the restriction degree matrix R for the weighting of the equation (matrix equation) 18, rows in regard to the node i are extracted from the restriction degree matrix R and formed into a diagonalized restriction degree matrix $R_d(i)$ in the same ways as the case of the priority matrix L. The following equation 22 shows the diagonalized restriction degree matrix $R_d(i)$:

$$R_d(i) = \text{diag}([R_{i1} \ldots R_{iN}]) \quad \text{(Equation 22)}$$

<<Weight Coefficient Matrix G(i)>>

A weight coefficient matrix G(i) considering both the priority and the restriction degree is formed by combining the aforementioned diagonalized priority matrix $L_d(i)$ shown in the equation 20 with the diagonalized restriction degree matrix $R_d(i)$ shown in the equation 22. The weight coefficient matrix G(i) is shown in the following equation 23:

$$G(i) = \begin{bmatrix} L_d(i) & 0 \\ 0 & R_d(i) \end{bmatrix} \quad \text{(Equation 23)}$$

By multiplying both sides of the equation 18 by the weight coefficient matrix G(i) (the above equation 23) from the left, the following equation 24 is obtained:

$$G(i)\begin{bmatrix} K(i) \\ I_N \end{bmatrix}\begin{bmatrix} \Delta f_{i1} \\ \vdots \\ \Delta f_{iN} \end{bmatrix} = G(i)\begin{bmatrix} \Delta \dot{V}_{i1} \\ \vdots \\ \Delta \dot{V}_{iN} \\ \Delta f_{ref1} \\ \vdots \\ \Delta f_{refN} \end{bmatrix} \quad \text{(Equation 24)}$$

<<Weighted Least Square Problem>>

The above equation 24 represents an operation of weighting each equation constituting the mathematical equation 18 with a diagonal element (weight coefficient) of the weight coefficient matrix G(i). The solution of the equation 24 as the weighted least square problem is given by the following equation 25:

$$\begin{bmatrix} \Delta f_{i1} \\ \vdots \\ \Delta f_{iN} \end{bmatrix} = \left( \begin{bmatrix} K(i) \\ I_N \end{bmatrix}^T G(i)^2 \begin{bmatrix} K(i) \\ I_N \end{bmatrix} \right)^{-1} \begin{bmatrix} K(i) \\ I_N \end{bmatrix}^T G(i)^2 \begin{bmatrix} \Delta \dot{V}_{i1} \\ \vdots \\ \Delta \dot{V}_{iN} \\ \Delta f_{ref1} \\ \vdots \\ \Delta f_{refN} \end{bmatrix}$$ (Equation 25)

<<Operation Amount $\Delta f_{ij}$>>

In the above equation 25, $\Delta f_{i1}, \ldots, \Delta f_{iN}$ on the left side represents the operation amount of each voltage control device (102 in FIG. 1) distributed in the distributed controller 107 (FIG. 1) of the node i.

The distributed controller 107 outputs the operation amount $\Delta f_{ii}$ regarding its own node i (included in the solutions shown in the equation 25) to the voltage control device 102 as the control command 117 (FIG. 1).

The operation amounts of the voltage control devices optimally distributed according to the equation 25 contribute to the reduction of the voltage deviation of the whole system. Further, the optimization of the distribution of the operation amounts to the voltage control devices realizes reduction in the power consumption of the voltage control devices and more desirable control by the electric power system control system taking various restrictions at respective sites into consideration.

Incidentally, while the weight coefficient matrix G(i) shown in the equation 25 includes the diagonalized priority matrix $L_d(i)$ and the diagonalized restriction degree matrix $R_d(i)$, it is also possible to solve the problem by exclusively using the diagonalized priority matrix $L_d(i)$ regarding the priority, or by exclusively using the diagonalized restriction degree matrix $R_d(i)$ regarding the restriction degree.

<Change in System Voltage Due to Voltage Control Device>

The voltage of the distribution system is controlled by the superposition of the voltage change amounts caused by the voltage control devices. This operation will be schematically shown and explained below.

FIGS. 4A to 4E are schematic diagrams showing an example of a situation in which the voltage of the distribution system is controlled by the superposition of the voltage change amounts caused by the voltage control devices of the electric power system control system in accordance with the embodiment of the present invention.

FIGS. 4A to 4E show the overall configuration of an electric power system 401 and four examples of the change in the system voltage at each position from a power transmission end 405 to a power reception end 406 of the electric power system 401.

In FIG. 4A, a plurality of loads 402, an SVR 403 and an SVC 404 are connected to the electric power system 401.

In a state in which the SVR 403 and the SVC 404 are not in operation, the system voltage gradually drops from the power transmission end 405 toward the power reception end 406 (voltage drop) as shown in the voltage graph 407.

When the SVR 403 is activated in this state, the system voltage is boosted at the point A corresponding to the installation position of the SVR 403 as shown in the voltage graph 408.

When the SVC 404 is activated, the system voltage is boosted at the point B corresponding to the installation position of the SVC 404 as shown in the voltage graph 409.

When the SVR 403 and the SVC 404 are activated simultaneously, the system voltage is boosted at points corresponding to the points A and B (superposition) as shown in the voltage graph 410.

As explained above, the voltage deviation in the electric power system (whole electric power system) 401 is reduced by properly controlling and activating the SVR 403 and the SVC 404.

<Relationship Between Weight Coefficient Matrix and Centralized Control, Local Control and Distributed Cooperative Control, Explanation 1>

Next, an explanation will be given below to show that seamless transition among centralized control, local control and distributed cooperative control (seamless selection of appropriate control to be used) is possible by properly setting the elements of the reliability matrix, the priority matrix and the restriction degree matrix.

<<Centralized Control with Reliability Matrix W and Priority Matrix L>>

First, centralized control performed by setting the elements of the reliability matrix W and the priority matrix L will be explained.

If all the elements of the reliability matrix W are set at 1 as shown in the following equation 26A, it means that the distributed controllers 107 of all nodes are acquiring measurement values of the same accuracy as one another.

If all the elements of the priority matrix L are set at 1, it means that the distributed controllers 107 of all nodes are assigning the operation amounts in the same distribution as one another.

The control with the reliability matrix W whose elements are all 1 and the priority matrix L whose elements are all 1 is equivalent to the centralized control.

$$W = \begin{bmatrix} 1 & \cdots & & & 1 \\ & 1 & & & \\ \vdots & & \ddots & & \vdots \\ & & & 1 & \\ 1 & \cdots & & & 1 \end{bmatrix}$$ (Equation 26A)

$$L = \begin{bmatrix} 1 & \cdots & & & 1 \\ & 1 & & & \\ \vdots & & \ddots & & \vdots \\ & & & 1 & \\ 1 & \cdots & & & 1 \end{bmatrix}$$ (Equation 26B)

<<Local Control with Reliability Matrix W, Priority Matrix L and Restriction Degree Matrix R>>

Next, local control performed by setting the elements of the reliability matrix W, the priority matrix L and the restriction degree matrix R will be explained.

If the non-diagonal elements of the reliability matrix W are set at 0 as shown in the following equation 27A, it means that the distributed controller 107 of each node is acquiring the measurement values of its own node only.

If the non-diagonal elements of the priority matrix L are set at 0 as shown in the following equation 27B, it means that the distributed controller 107 of each node is controlling the voltage of its own node (own-node voltage) only.

The control in which the distributed controller 107 of each node is acquiring the measurement values of its own node only and controlling the own-node voltage only is equivalent to the local control in which each voltage control device is controlled independently.

In this example, the diagonal elements of the restriction degree matrix R are set at 0 and the non-diagonal elements of the restriction degree matrix R are set at 1 as shown in the following equation 27C. Assigning the restriction value 0 to the own node as above means that the distributed controller 107 of each node assigns the operation amount to the voltage control device 102 of its own node only. Incidentally, the restriction on the other nodes is in operation with the restriction value 1.

$$W = \begin{bmatrix} 1 & \cdots & 0 \\ & 1 & & \\ \vdots & & \ddots & \vdots \\ & & & 1 \\ 0 & \cdots & & 1 \end{bmatrix} \quad \text{(Equation 27A)}$$

$$L = \begin{bmatrix} 1 & \cdots & 0 \\ & 1 & & \\ \vdots & & \ddots & \vdots \\ & & & 1 \\ 0 & \cdots & & 1 \end{bmatrix} \quad \text{(Equation 27B)}$$

$$R = \begin{bmatrix} 0 & \cdots & 1 \\ & 0 & & \\ \vdots & & \ddots & \vdots \\ & & 0 & \\ 1 & \cdots & 0 \end{bmatrix} \quad \text{(Equation 27C)}$$

<<Distributed Cooperative Control with Reliability Matrix W and Priority Matrix L>>

Next, distributed cooperative control with the reliability matrix W and the priority matrix L will be explained.

If not only the diagonal elements (1) of the reliability matrix W but also part of the non-diagonal elements of the reliability matrix W are set at nonzero values (e.g., 0.7) as shown in the following equation 28A, it means that the distributed controller 107 of each node is also partially acquiring measurement values of other ends.

If part of the non-diagonal elements of the priority matrix L are set at nonzero values as shown in the following equation 28B, it means that the distributed controller 107 of each node is also partially controlling the voltages of other ends. These settings correspond to the distributed cooperative control.

$$W = \begin{bmatrix} 1 & \cdots & & & 0 \\ & 1 & 0.7 & & \\ \vdots & 0.7 & \ddots & 0.7 & \vdots \\ & & 0.7 & 1 & \\ 0 & & & \cdots & 1 \end{bmatrix} \quad \text{(Equation 28A)}$$

$$L = \begin{bmatrix} 1 & \cdots & & & 0 \\ & 1 & 0.7 & & \\ \vdots & 0.7 & \ddots & 0.7 & \vdots \\ & & 0.7 & 1 & \\ 0 & & & \cdots & 1 \end{bmatrix} \quad \text{(Equation 28B)}$$

<Relationship Between Weight Coefficient Matrix and Centralized Control, Local Control and Distributed Cooperative Control, Explanation 2>

As explained above, in the electric power system control system in accordance with the present invention, the control characteristic can be switched among the centralized control, the local control and the distributed cooperative control through the setting of the reliability and the priority.

Further, seamless transition between the local control and the centralized control via the distributed cooperative control is possible by variously setting the nonzero elements as part of the non-diagonal elements of the reliability matrix and part of the non-diagonal elements of the priority matrix in the distributed cooperative control.

<Flow Chart Showing Operation of Electric Power System Control System>

Next, a flow chart showing the operation of the electric power system control system will be explained below.

Figure 5:
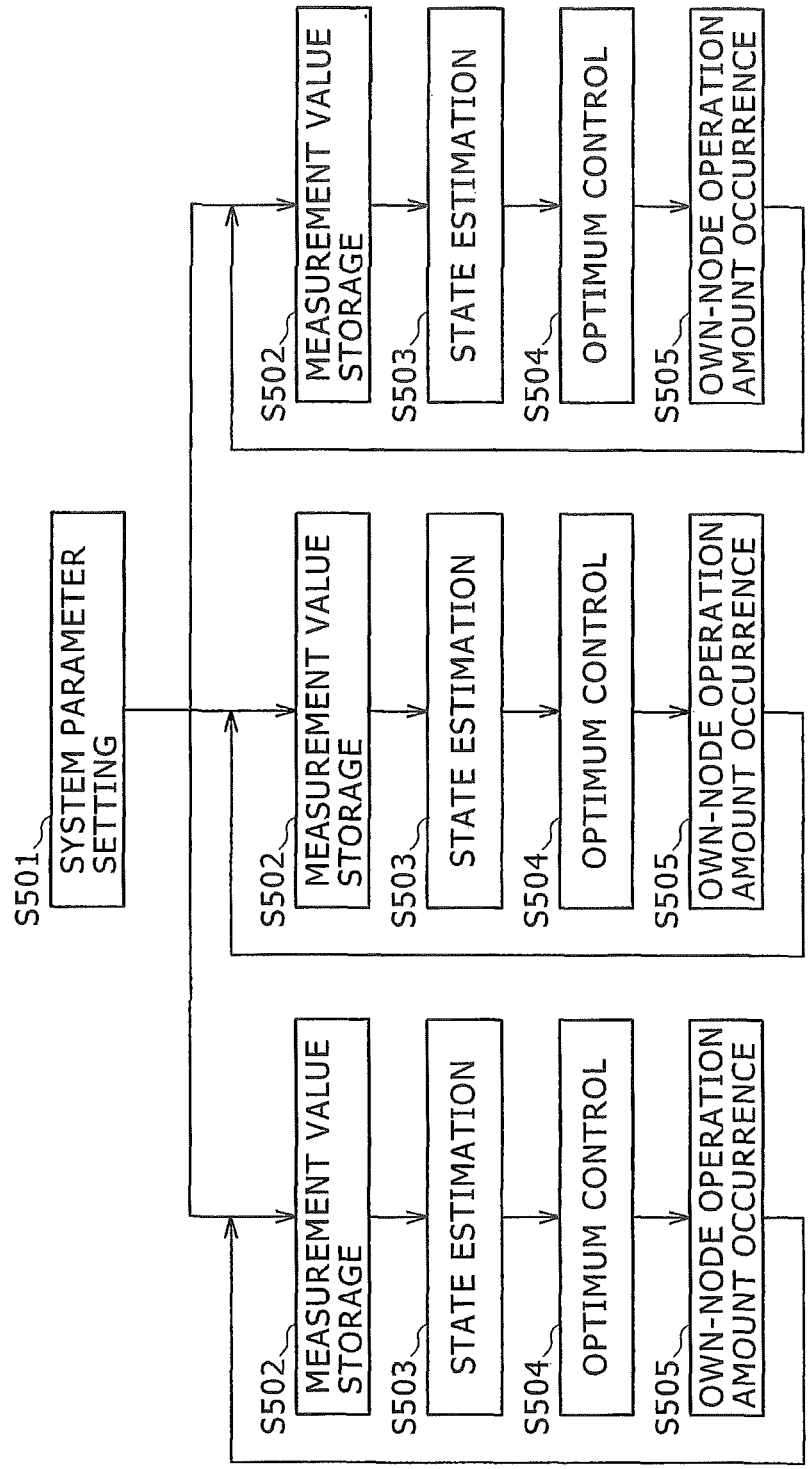
FIG. 5 is a flow chart showing the operation of the electric power system control system in accordance with the embodiment of the present invention.

FIG. 5 is a flow chart showing the operation of the electric power system control system 100 in accordance with the embodiment of the present invention.

FIG. 5 includes steps from step S501 to step S505. Since the steps S502-S505 are common to the distributed controllers 107 (FIG. 1), the steps S502-S505 regarding only one distributed controller 107 will be explained below.

<Step S501>

In the step S501, the system topology and the circuit impedance are set in the system parameters 111 (FIG. 1) of each distributed controller 107 (system parameter setting) as the initial setting at the start of the operation.

<Step S502>

In the operation, the distributed controller 107 in the step S502 first stores the own-node measurement values 112 (FIG. 1) and the other-node measurement values 113 (FIG. 1) obtained via the communication line (FIG. 1) in the measurement value table 108 (FIG. 1) (measurement value storage).

<Step S503>

In the next step S503, the state estimation function 109 (FIG. 1) receives the measurement values stored in the measurement value table 108 and estimates each node voltage and each node current as state quantities of the electric power system by using the system parameters 111 (state estimation).

<Step S504>

In the step S504, the optimum control function 110 (FIG. 1), receiving the estimate value 114 (FIG. 1) as the output of the state estimation function 109, the target value 115 of the voltage control (FIG. 1) and the restriction value 116 of the operation amount (FIG. 1) as input data, appropriately distributes operation amounts to the voltage control devices 102 (FIG. 1) by using the system parameters 111 and the input data so as to eliminate the voltage deviation between the estimate value 114 and the target value 115 and outputs the operation amount regarding the own node to the voltage control device 102 as the control command 117 (FIG. 1) (optimum control).

<Step S505>

In the step S505, the voltage control device 102 changes the operation amount (tap ratio if the voltage control device 102 is an SVR, reactive current output if the voltage control device 102 is an SVC) according to the control command 117 (own-node operation amount occurrence). Thereafter, the process returns to the step S502.

The process from the step S502 to the step S505 is executed by each pair of voltage control device 102 and distributed controller 107 in parallel as mentioned above.

This operation is indicated by the parallel arrangement of the steps S502-S505 in FIG. 5.

<Data Structure of Measurement Value Table>

Next, the data structure of the measurement value table, in which the measurement values are stored in the step S502 (FIG. 5), will be explained below.

FIG. 6 is a schematic diagram showing the data structure of the measurement value table 108 (FIG. 1) storing the own-node measurement values 112 (FIG. 1) and the other-node measurement values 113 obtained restrictively via the communication line (FIG. 1) in the electric power system control system 100 (FIG. 1) in accordance with the embodiment of the present invention.

In FIG. 6, each record of data (record values) corresponds to each node. Each record includes a node number, update time, voltage, current (active current, reactive current), rated voltage, and rated current (rated active current, rated reactive current).

In the example of FIG. 6, data of the node (node number) 1 and the node 2 are relatively new data, in which the latest update time and the voltage, the active current and the reactive current at that time have been recorded.

The nodes 4 and 5 have older time stamps of the update time compared with the nodes 1 and 2, and thus the measurement values of the nodes 4 and 5 are considered to be of lower accuracy. The state estimation function 109 (FIG. 1) sets the reliability values of the nodes 4 and 5 at low values and substitutes the low reliability values into the least square problem of the equation 14.

The node 3 is a branch end, and thus no measurement values (active current, reactive current) exist in the node 3 in the first place. Thus, the state estimation function 109 sets the reliability of the node 3 at 0.

In contrast, while the node 6 does not have its own measurement values since no measurement has been performed yet at this point, there is a possibility of measurement and there exist rated values (rated active current, rated reactive current). Thus, the state estimation function 109 sets the reliability of the node 6 at a low value while substituting the rated values into the least square problem of the equation 14 as substitute values of the measurement values.

<Supplementary Explanation of Embodiment>

As explained above, in the electric power system control system in accordance with the present invention, each distributed controller estimates the state quantities of the electric power system based on the own-node measurement values and the other-node measurement values obtained restrictively via the communication line as input data and outputs the control command to its own node based on the estimated state quantities so that the operation amount of the voltage control device of the own node and the operation amounts of the voltage control devices of the other nodes are in optimum distribution. Consequently, the voltage deviation of the whole electric power system can be reduced by the superposition of the voltage changes caused by the voltage control devices.

Further, by introducing the reliability matrix corresponding to the measurement accuracy, estimate values regarding the voltages and the currents of the whole electric power system with less errors can be obtained.

Furthermore, by introducing the priority matrix for eliminating the voltage deviation preferentially for sensitive loads and the restriction degree matrix in which the strength of restriction is set in regard to each control device as a target of restriction, reduction in the power consumption of the voltage control devices and more desirable control taking various restrictions at respective sites into consideration are realized.

Moreover, by introducing the aforementioned reliability matrix, priority matrix and restriction degree matrix and properly selecting and setting elements of these matrices, control with the seamless transition among the local control, the distributed cooperative control and the centralized control becomes possible.

DESCRIPTION OF REFERENCE CHARACTERS 1-9, 103 node
100, 200 electric power system control system
101, 212, 216, 217, 219, 319, 402 load
102 voltage control device
104, 401 electric power system
105 sensor
106 communication line
107 distributed controller
108 measurement value table (measurement value data collection functional unit)
109 state estimation function (state estimation functional unit)
110 optimum control function (optimum control functional unit)
111 system parameter
112 own-node measurement value
113 other-node measurement value
114 estimate value
115 target value
116 restriction value
117 control command
201, 405 power transmission end
202, 206, 209 load end
203 branch end
204, 205 SVR end
208 SVC end
201, 405 power transmission end
211 distribution line
218, 318, 404 SVC
234 first distribution system
237 second distribution system
245, 345, 403 SVR
406 power reception end
407, 408, 409, 410 voltage graph

The invention claimed is:

1. An electric power system control system controlling voltages in an electric power system to which loads and voltage control devices are connected via nodes, comprising:
at least two distributed controllers making control commands for the voltage control devices, wherein
the distributed controller includes a measurement value data collection functional unit, a state estimation functional unit, and an optimum control functional unit,
the measurement value data collection functional unit collects measurement value data from sensors measuring a voltage and a current in an own node to which the measurement value data collection functional unit belongs and measurement value data from sensors measuring a voltage and a current in another node to which the measurement value data collection functional unit does not belong,
the state estimation functional unit, using the measurement values of the voltage and the current of the own node and the measurement values of a voltage and a current of another node as input data, estimates a voltage or a current as a state quantity of the electric power system regarding another node from which the measurement value data cannot be collected, and outputs the estimate values,
the optimum control functional unit, using the measurement value data, the estimate value outputted from the state estimation functional unit and a voltage target value that has been set for each node as input, outputs the control commands based on operation amounts to be distributed to the voltage control devices of the nodes including the own node, and the voltages in the electric power system are controlled by superposition of voltage change amounts by the voltage control devices, and the state estimation functional unit calculates the estimate value of the voltage or the current of each of the nodes by solving a least square problem for minimizing an error with respect to a power equation regarding the voltage or the current between each node and an adjacent node and an error with respect to the measurement values of the voltage or the current of each node.

2. The electric power system control system according to claim 1, wherein estimate values further reducing the error with respect to highly accurate measurement values are calculated by weighting the least square problem with reliability which represents the degree of accuracy of each of the measurement values.

3. The electric power system control system according to claim 1, wherein the optimum control functional unit calculates the operation amount of each of the voltage control devices by solving a least square problem for minimizing a deviation with respect to the voltage target value of each node and an error with respect to a restriction value of the operation amount of each of the voltage control devices.

4. The electric power system control system according to claim 3, wherein operation amounts further reducing the deviation with respect to target values having high priority are calculated by weighting the least square problem with priority regarding achievement of the target value.

5. The electric power system control system according to claim 3, wherein operation amounts further reducing the error with respect to highly restrictive restriction values are calculated by weighting the least square problem with a restriction degree which represents the strength of the restriction by each restriction value.

6. The electric power system control system according to claim 1, wherein the measurement value data collection functional unit collects the measurement values of the other nodes via a communication line.

7. The electric power system control system according to claim 1, wherein the voltage control devices each include an automatic voltage regulator (SVR: Step Voltage Regulator), a reactive power compensator (SVC: Static Var Compensator), a distribution voltage control system (DMS: Distribution Management System), a power conditioner (PCS: Power Conditioning System), an instantaneous voltage compensation device (DVR: Dynamic Voltage Restorer), an uninterruptible power supply (UPS), a home energy management system (HEMS), or a distribution transformer having the voltage regulation function.

8. An apparatus for controlling voltages in an electric power system to which loads and voltage control devices are connected via nodes, the apparatus comprising:

a distributed controller that includes a measurement value data collection functional unit, a state estimation functional unit, and an optimum control functional unit, wherein the measurement value data collection functional unit collects measurement value data from sensors measuring a voltage and a current in an own node to which the measurement value data collection functional unit belongs and measurement value data from sensors measuring a voltage and a current in another node to which the measurement value data collection functional unit does not belong, the state estimation functional unit, using the measurement values of the voltage and the current of the own node and the measurement values of a voltage and a current of another node as input data, estimates voltage or a current as a state quantity of the electric power system regarding another node from which the measurement value data cannot be collected, and outputs the estimate values, the optimum control functional unit, using the measurement value data, the estimate value outputted from the state estimation functional unit and a voltage target value that has been set for each node as input, outputs the control commands based on operation amounts to be distributed to the voltage control devices of the nodes including the own node, and the voltages in the electric power system are controlled superposition of voltage change amounts by the voltage control devices, and the state estimation functional unit calculates the estimate value of the voltage or the current of each of the nodes by solving a least square problem for minimizing an error with respect to a power equation regarding the voltage or the current between each node and an adjacent node and an error with respect to the measurement values of the voltage or the current of each node.

9. The apparatus according to claim 8, wherein the voltage control devices each include an automatic voltage regulator (SVR: Step Voltage Regulator), a reactive power compensator (SVC: Static Var Compensator), a distribution voltage control system (DMS: Distribution Management System), a power conditioner (PCS: Power Conditioning System), an instantaneous voltage compensation device (DVR: Dynamic Voltage Restorer), an uninterruptible power supply (UPS), a home energy management system (HEMS), or a distribution transformer having the voltage regulation function.

10. An electric power system control system controlling voltages in an electric power system to which loads and voltage control devices are connected via nodes, comprising at least two distributed controllers making control commands for the voltage control devices, wherein the distributed controller includes a measurement value data collection functional unit, a state estimation functional unit, and an optimum control functional unit, wherein the measurement value data collection functional unit collects measurement value data from sensors measuring a voltage and a current in an own node to which the measurement value data collection functional unit belongs and measurement value data from sensors measuring a voltage and a current in another node to which the measurement value data collection functional unit does not belong, wherein the state estimation functional unit, using the measurement values of the voltage and the current of the own node and the measurement values of a voltage and a current of another node as input data, estimates a voltage or a current as a state quantity of the electric power system regarding another node from which the measurement value data cannot be collected, and outputs the estimate values, wherein the optimum control functional unit, using the measurement value data, the estimate value outputted from the state estimation functional unit and a voltage target value that has been set for each node as input, outputs the control commands based on operation amounts to be distributed to the voltage control devices of the nodes including the own node, and wherein the voltages in the electric power system are controlled by superposition of voltage change amounts by the voltage control devices, and the optimum control functional unit calculates the operation amount of each of the voltage control devices by solving a least square problem for minimizing a deviation with respect to the voltage target value of each node and an error with respect to a restriction value of the operation amount of each of the voltage control devices.

* * * * *